United States Patent [19]

Sunder et al.

[11] Patent Number: 4,990,372

[45] Date of Patent: Feb. 5, 1991

[54] METHOD FOR PRODUCING WEAR RESISTANT INTERNAL SURFACES OF STRUCTURES

[75] Inventors: Swaminathan Sunder, Allentown; Diwakar Garg, Macungie; Paul N. Dyer, Allentown, all of Pa.

[73] Assignee: Air Products and Chemicals, Inc., Allentown, Pa.

[21] Appl. No.: 388,104

[22] Filed: Jul. 31, 1989

Related U.S. Application Data

[63] Continuation-in-part of Ser. No. 92,809, Sep. 3, 1987, Pat. No. 4,874,642, and a continuation-in-part of Ser. No. 153,738, Feb. 8, 1988, Pat. No. 4,855,188.

[51] Int. Cl.$^5$ .................. C23C 16/08; C23C 16/32; C23C 16/46
[52] U.S. Cl. .................................. 427/237; 427/249; 427/253; 427/255.2; 427/327; 427/328; 427/383.7; 427/404; 427/405; 427/419.7; 427/437
[58] Field of Search ............ 427/237, 249, 253, 255.2, 427/255, 299, 327, 328, 329, 331, 404, 405, 419.7, 436, 437, 438, 387.7

[56] References Cited

U.S. PATENT DOCUMENTS

| | | | |
|---|---|---|---|
| 3,127,641 | 4/1964 | Pertwee | 22/204 |
| 3,368,914 | 2/1968 | Darnell et al. | 427/249 |
| 3,389,977 | 6/1968 | Tarver | 427/249 |
| 3,417,453 | 12/1968 | Clarke | 29/460 |
| 3,476,080 | 11/1969 | Clarke | 118/44 |
| 3,523,035 | 8/1970 | Whitlow | 117/97 |
| 3,574,672 | 4/1971 | Tarver | 427/249 |
| 3,721,577 | 8/1968 | Wiermer | 427/249 |
| 3,741,793 | 12/1963 | Simmons | 117/93.4 |
| 3,814,625 | 6/1974 | Lewin et al. | 427/249 |
| 4,008,976 | 2/1977 | Holzl | 427/249 |
| 4,123,989 | 11/1978 | Jewett | 118/49.5 |
| 4,132,816 | 1/1979 | Benden et al. | 427/237 |
| 4,138,512 | 2/1979 | Glaski | 427/237 |
| 4,145,456 | 3/1979 | Küppers et al. | 427/38 |
| 4,145,458 | 3/1979 | Koenings et al. | 427/39 |
| 4,162,345 | 7/1979 | Holzl | 428/328 |
| 4,294,871 | 10/1987 | Hieber et al. | 427/237 |
| 4,354,456 | 10/1982 | Campbell et al. | 118/721 |
| 4,385,645 | 3/1983 | Campbell | 138/139 |
| 4,388,095 | 6/1983 | Schneider et al. | 65/18.2 |
| 4,405,655 | 9/1983 | Tuin | 427/38 |
| 4,427,445 | 1/1984 | Holzl et al. | 75/234 |
| 4,473,536 | 9/1984 | Beerwald et al. | 427/10 |
| 4,537,791 | 8/1985 | Tarjan | 427/2 |
| 4,714,589 | 12/1987 | Auwerds et al. | 427/39 |
| 4,741,975 | 5/1988 | Naik et al. | 428/621 |
| 4,764,398 | 8/1988 | Croitoru et al. | 427/237 |

FOREIGN PATENT DOCUMENTS

| | | | |
|---|---|---|---|
| 1326769 | 10/1970 | United Kingdom | 427/249 |
| 1540718 | 3/1975 | United Kingdom | 427/249 |

*Primary Examiner*—Norman Morgenstern
*Assistant Examiner*—Margaret Bueker
*Attorney, Agent, or Firm*—Richard A. Dannells, Jr.; James C. Simmons; William F. Marsh

[57] ABSTRACT

A method is described for improving the erosion and abrasion wear resistance and hardness of the internal wear surfaces of structures such as nozzles, jets, ducts, chutes, powder handling tubes, valve housings, conveyors, drill bushings and the like. A substantially pure tungsten layer is chemical vapor deposited on the internal wear surface of the body of the structure followed by a chemical vapor deposited top coating comprising a mixture of tungsten and tungsten carbide. The tungsten carbide is selected from the group consisting of $W_2C$, $W_3C$, and mixtures thereof and is fine grained, non-columnar and has a substantially layered microstructure. Also described are structures formed by the method.

24 Claims, 5 Drawing Sheets

FIG.1

10 MICRONS

METHOD FOR PRODUCING WEAR RESISTANT INTERNAL SURFACES OF STRUCTURES

This application is a continuation-in-part of U.S. application Ser. No. 07/092,809, filed Sept. 3. 1987, now U.S. Pat. No. 4,874,642, issued Oct. 17, 1989 and U.S. application Ser. No. 07/153,738, filed Feb. 8, 1988, now U.S. Pat. No. 4,855,188, issued Aug. 8, 1989.

This invention relates generally to structures such as drill bushings and the like in which an internal surface is subjected to excessively high wear. More particularly, the invention relates to a method for improving the hardness, erosion and abrasion wear resistance of the internal wear surfaces of structures, and to such structures having improved hardness, erosion and abrasion wear resistance.

BACKGROUND OF THE INVENTION

The internal surfaces of numerous structures are typically subjected to excessively high wear. In one example of such structures, i.e., drill bushings, the structures are used to guide drills or reamers on automated machines. Because it is critical to maintain the hole locations within specified tolerances, the structures themselves have very tight tolerances, typically 0.0002" on the inner and outer diameters and 0.0003" on concentricity between the two diameters. They are most commonly employed in the automotive and aerospace industries, but they have much wider applicability. Over 95% of the bushings sold currently are made out of 1144 carbon steel hardened to 500 to 600 kgf/mm$^2$ by carburizing before finish machining. They undergo abrasive wear by machined metal chips that flow in the space between the drill flutes and the bushings. Thus, they must be frequently replaced which results in costly downtime. The industries have been looking for reliable alternatives that would increase the life of drill bushings while maintaining their dimensional tolerances.

Many techniques have been employed for lengthening the wear life of drill bushings. Such techniques include replacing the 1144 carbon steel bushings with cemented tungsten carbide bushings either in monolithic form or as sleeves slip-fit into steel bodies. Cemented carbide is much harder than 1144 carbon steel, with a Vickers hardness of about 2000 kgf/mm$^2$, and provides better wear resistance. However, monolithic cemented carbide bushings are very brittle and break when misaligned drill robots hit them with the drills. Although the sleeve-type cemented carbide bushings last about four times as long as carbon steel bushings, they are about four times as expensive.

Surface hardening techniques have been used on bushings made out of either tool steel or 1144 carbon steel to improve their life. For example, case hardening have been commonly applied, but such techniques do not provide sufficient improvement in life to meet the current needs of industry. Hard coatings such as chemical vapor deposited titanium carbide and titanium nitride have also been tried with little success because of the degradation of the mechanical properties and deformation of the parts by high temperatures ($\sim 900°$ C.) used during the deposition process.

The thermochemically deposited coatings described in U.S. Pat. No. 4,008,976 issued Feb. 22, 1977 to Robert A. Holzl have also been tried to prolong the life of drills and other cutting tools. Although very thin coatings described in this patent have been attempted on cutting tools and the like, such coatings have not been successful. This is true because such coatings are deposited at very high temperatures, causing degradation of the mechanical properties and deformation of the parts.

U.S. Pat. No. 4,162,345, issued July 24, 1979 to Robert A. Holzl, discloses a method for producing deposits characterized by a structure which is free of columnar grains and instead consists essentially of fine, equiaxial grains. These deposits have unusually high hardness and tensile strength. However, this patent discloses use of temperatures varying from 650° C. to 1100° C. which are high enough to degrade the mechanical properties and deformation (or mechanical distortion) of metallic substrates. The material of Holzl U.S. Pat. No. 4,162,345 is a hard metal alloy, consisting primarily of tungsten and carbon. X-ray diffraction analysis of the U.S. Pat. No. 4,162,345 alloy shows that the deposit is akin to tungsten but with a very finely dispersed carbide, probably in the form of WC.

U.S. Pat. No. 4,427,445, Issued Jan. 24, 1984 to Robert A. Holzl, et al. also discloses a hard fine grained material which can be produced by thermochemical deposition, but at temperatures lower than those described in the U.S. Pat. No. 4,162,345. Thus, where there are large differences in the thermal coefficients of expansion between the substrate material and the coating material, the U.S. Pat. No. 4,427,445 methodology reduces adhesion problems and problems associated with mechanical distortion, metallurgical transformation or stress relief of the substrate. The material of the U.S. Pat. No. 4,427,445 Holzl, et al. patent is a tungsten carbon alloy consisting primarily of a two phase mixture of substantially pure tungsten and an A15 structure.

U.S. Pat. No. 3,368,914, discloses a process for adherently depositing tungsten carbide of substantial thickness on steel and other metal substrates. The process involves first diffusing another metal on the surface of the substrate to relax the thermal expansion coefficient zone of the metal substrate. The carbide coating is then deposited on the diffused surface by chemical vapor deposition. The process claims it is preferable to diffuse the metal forming the carbide into the substrate. In one embodiment of the claimed process, a thin layer of tungsten is deposited on the metal surface using a temperature of 600°-1000° C. After coating tungsten, the temperature is increased to approximately 1000°-1200° C. and held there for a significant period of time to permit diffusion of tungsten into the metal. The diffused surface is then coated with tungsten carbide using WF$_6$, CO and H$_2$. In the alternative embodiment, a pack diffusion technique is used for achieving diffusion of tungsten into metal. Temperature ranging from 1000°-1200° C. is used in the pack diffusion step. The diffused metal surface is then coated with tungsten carbide. Since a temperature ranging from 1000°-1200° C. is used during the process, the U.S. Pat. No. 3,368,914 process is not suitable for providing erosion and abrasion wear resistance coatings on various metallic substrates without severely distorting and degrading their mechanical properties.

U.S. Pat. No. 3,389,977, discloses a method of depositing substantially pure tungsten carbide in the form of W$_2$C, free from any metal phase. Pure W$_2$C is deposited on a substrate by reacting WF$_6$ and CO. The substrate is heated to a temperature in excess of 400° C. The adherence of W$_2$C to steel is improved by first cleaning the surface and then depositing with a thin film of tungsten followed by W$_2$C using a temperature ranging from 600°–1000° C. Since initial deposition of tungsten is conducted at or above 600° C., the U.S. Pat. No. 3,389,977 process is not suitable for providing erosion and abrasion wear resistance coating on metallic substrates without severely degrading their mechanical properties and deforming the structure. Additionally pure $W_2C$ deposited according to the teachings of the U.S. Pat. No. 3,389,977 consists of columnar grains. The U.S. Pat. No. 3,389,977 does not describe a process for depositing $W_2C$ coating in non-columnar and substantially layered fashion.

U.S. Pat. No. 3,574,672 discloses a process for depositing $W_2C$ by heating a substrate to a temperature between 400°–1300° C. The process described in this patent is essentially the same as disclosed in U.S. Pat. No. 3,389,977.

U.S. Pat. No. 3,721,577 discloses a process for depositing refractory metal or metal carbides on ferrous and non-ferrous base materials heated to at least 1050° C. The metal carbides are deposited using halide vapors of the metal along with methane and hydrogen. This process is not suitable for applications where structural tolerances are very tight.

U.S. Pat. No. 3,814,625 discloses a process for the formation of tungsten and molybdenum carbide by reacting a mixture of $WF_6$ or $MoF_6$, benzene, toluene or xylene and hydrogen. The process is carried out under atmospheric pressure and temperatures ranging from 400°–1000° C. An atomic ratio of W/C in the gaseous mixture varying from 1 to 2 is required to yield $W_2C$. The process also suggests that for some substrates such as mild steel, it is advantageous in providing better adhesion to deposit a layer of nickel or cobalt prior to tungsten carbide deposition. The process also claims the formation of a mixture of tungsten and tungsten carbide in the presence of large proportions of free hydrogen. The mixture of W and $W_2C$ coating deposited according to the teaching of the U.S. Pat. No. 3,814,625 consists of columnar grains. The U.S. Pat. No. 3,814,625 does not disclosed a process for depositing a mixture of W and $W_2C$ in non-columnar and substantially layered fashion.

British Patent 1,326,769 discloses a method for the formation of tungsten carbide by reacting a mixture of $WF_6$, benzene. toluene or xylene and hydrogen under atmospheric pressure and temperatures ranging from 400°–1000° C. The process disclosed in this patent is essentially the same as disclosed in U.S. Pat. No. 3,814,625.

British Pat. No. 1,540,718 discloses a process for the formation of $W_3C$ using a mixture of $WF_6$, benzene, toluene or xylene and hydrogen under sub-atmospheric pressure and temperatures ranging from 350°–550° C. An atomic ratio of W/C in the gaseous mixture varying from 3–6 is required to yield $W_3C$. The coating deposited according to the teaching of British Pat. No. 1,540,718 consists of columnar grains. The British Pat. No. 1,540,718 does not teach a process for depositing a non-columnar and substantially layered coating.

Although the methods of the Holzl patents cited above have been useful in producing fine-grained tungsten-carbon alloys containing mixtures of W and WC, and W and A15 structure, and the methods described in other cited patents have been successful in producing columnar $W_3C$ or $W_2C$ or mixtures of W and $W_2C$, no one has yet disclosed a method for producing extremely hard, fine-grained, non-columnar tungsten-carbon alloys with substantially layered microstructure containing mixtures of tungsten and tungsten carbide in the form of $W_2C$ or $W_3C$ or a mixture of $W_2C$ and $W_3C$.

In co-pending U.S. application Ser. No. 07/092,809 now U.S. Pat. No. 4,874,642, issued Oct. 17, 1989, a method and coating are described comprising a non-columnar, fine grained having a substantially layered microstructure deposit of tungsten carbide in the form of $W_2C$, $W_3C$ or mixtures of $W_2C$ and $W_3C$ in admixture with tungsten.

In co-pending U.S. application Ser. No. 07/153,738 now U.S. Pat. No. 4,855,188, issued Aug. 8, 1989 such coatings are described in which an intermediate layer of substantially pure tungsten is used between the substrate and the mixture of tungsten and tungsten carbide outer layer to confer additional erosion and abrasion wear resistance characteristics on the composite coating system.

The coatings described in the co-pending applications are generally suitable for depositing on a wide range of substrates having both exterior and interior surfaces of large dimensions and of especially large cross-sectional area. They can be applied on inside surfaces of structures having small cross-sectional area, but they are deposited non-uniformly and generally fail to meet close tolerance requirements discussed earlier. The present invention is an improvement over the co-pending applications wherein wear resistant mixtures of tungsten and tungsten carbide coating systems are applied uniformly at low temperatures over the entire internal surfaces of structures of small dimensions such as a drill bushing or the like without distorting, deforming and degrading their mechanical properties by directing the mixture of reaction gases into contact with the heated internal surface. It has been found that by directing the reaction gas mixture into contact with the heated internal surface and controlling the reaction conditions, the internal surface can be uniformly coated to meet close tolerances. Furthermore, it has been found that any alteration in tolerances can easily be adjusted by lapping or other finishing techniques. It has also been found that such coating systems can confer substantial abrasion and erosion wear characteristics on the wear surfaces of such structures.

SUMMARY OF THE INVENTION

Very generally, the invention provides a method for improving the hardness, erosion and abrasion wear resistance of internal surfaces of structures subject to excessive wear. The structures may comprise various ferrous and non-ferrous metals and alloys, metal matrix composites and metal carbides.

The method of the present invention comprises the steps of directing a first reaction mixture of process gases comprised essentially of a tungsten halide and hydrogen into contact with an internal surface of a structure to chemical vapor deposit an intermediate layer of substantially pure columnar tungsten thereon and then directing to the tungsten coated internal surface a second reaction mixture of process gases comprised essentially of (1) a tungsten halide, (2) a volatile oxygen- and hydrogen-containing organic compound, and (3) hydrogen to deposit a coating of non-columnar, substantially layered, mixture of tungsten and tungsten carbide. The flow rates of tungsten halide and the oxygen- and hydrogen-containing organic compound are controlled in the second reaction mixture so that the W/C atomic ratio in the reaction mixture is within the range of about 0.5 to about 15 to deposit a mixture of W and $W_2C$, W and $W_3C$, or W and $W_2C$ and $W_3C$ onto said intermediate tungsten layer. The ratio of hydrogen to tungsten halide in the first and second reaction mixtures is controlled so that the first and second reaction mixtures each contains more than a stoichiometric amount of hydrogen which is required for the reduction of the tungsten halide. Preferably the ratio of hydrogen to tungsten halide is within the range of about 4 to about 20, and more preferably within the range of about 8 to about 12, for each of the foregoing chemical vapor deposition steps, the temperature is controlled in the range of about 300° to about 650° C, preferably in the range of about 300° to about 550° C., and the pressure is controlled within the range of about 1 Torr. to about 1000 Torr. The resulting innerlayer coating on the internal surface is columnar in nature. The resulting top coating on the inner columnar tungsten layer is fine grained, non-columnar and has a substantially layered microstructure and a thickness sufficient to confer a desired degree of erosion and abrasion, wear resistance and hardness on the internal surface.

An inert gas selected from nitrogen, helium or argon may be used as a diluent in the reaction mixtures during the deposition of both tungsten and a mixture of tungsten and tungsten carbide coatings.

In those cases where the structures to be coated are not made of nickel, cobalt, copper, molybdenum, tungsten and other metals and alloys which do not react with the hydrofluoric acid produced during the CVD process, the internal wear surfaces of the structures are provided with a base layer of a noble metal having a thickness sufficient to protect the surface against the corrosive reaction of hydrofluoric acid. The noble metal is selected from the group consisting of nickel, cobalt, copper, silver, gold, platinum, palladium, iridium, and mixtures thereof.

With regard to the tungsten halide component of the first and second reaction mixtures, according to the method of the invention, tungsten fluorides are preferred. Tungsten hexafluoride ($WF_6$) is especially preferred.

With regard to the oxygen- and hydrogen-containing organic compound of the second reaction mixture, preferred compounds are selected from group consisting of $C_1$-$C_4$ alcohols and aldehydes, $C_2$-$C_4$ ethers, epoxides and ketenes and $C_3$-$C_4$ ketones, for example, methanol, formaldehyde, ethanol, dimethyl ether, ketene (carbomethane), acetaldehyde, ethylene oxide, vinyl alcohol, acetone, acrolein, allyl alcohol, methyl ethyl ether, isopropyl alcohol, n-propyl alcohol, propylene oxide, propene oxide, propiolaldehyde, propionaldehyde, 2-propyne-1-ol, 3-methoxy propyne, vinyl ether, diethyl ether, furan, tetrahydrofuran, crotonaldehyde, and α-methyl acrolein. Especially preferred is the two carbon and one oxygen-containing organic compound. dimethyl ether (DME).

DETAILED DESCRIPTION OF THE INVENTION

Figure 1:
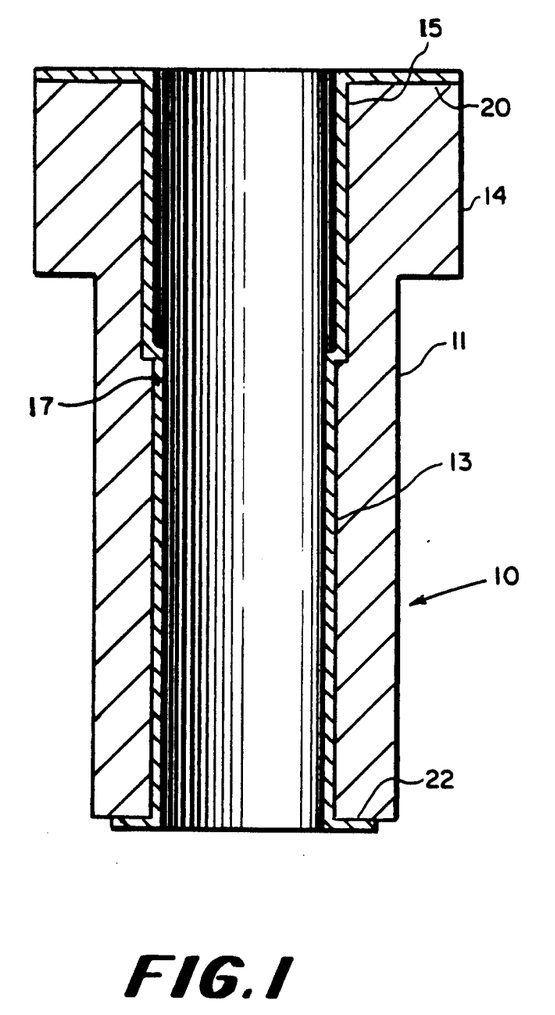
FIG. 1 is a vertical cross-sectional view of one type of structure, a drill bushing, in accordance with the present invention.

Referring now to FIG. 1, a steel drill bushing 10 is shown in cross section in which the CVD coating on the internal surface and portions of the exposed faces of the bushing is not shown to scale. The structure includes bushing body 11 which has internal bore 13 and bushing head 14 which has internal bore 15 of slightly larger diameter than internal bore 13. The surfaces of bores 13 and 15 are provided with a hard, highly erosion and abrasion wear resistant coating system 17. The coating system 17, described with particularity below, extends onto the upper face 20 and a substantial portion of lower face 22 and confers longer bushing life as a result of high erosion and abrasion wear resistance than conventional drill bushings.

Figure 2A:
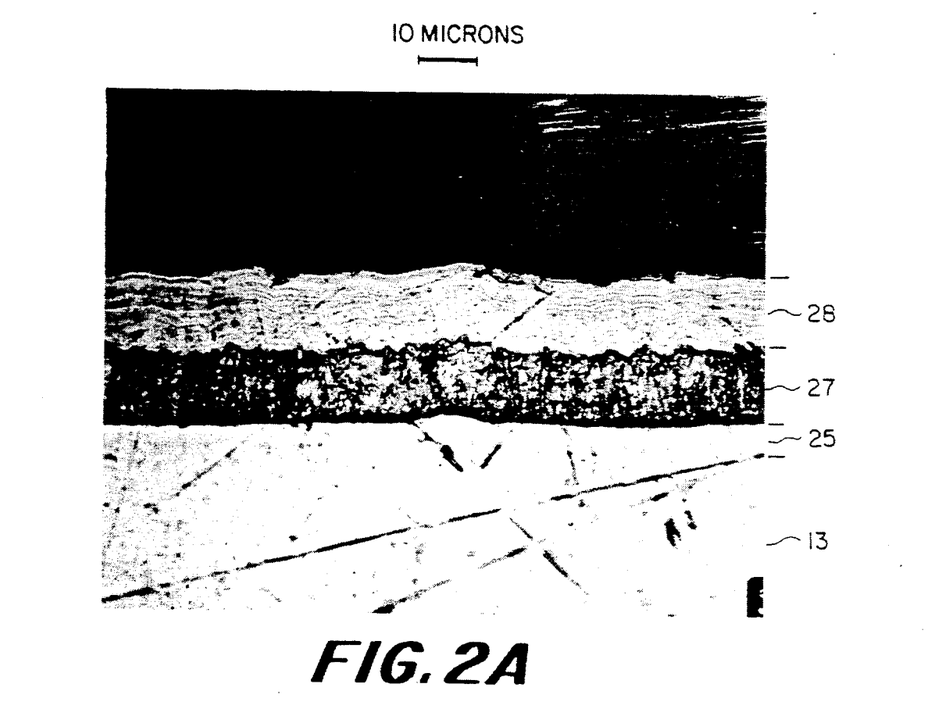
FIGS. 2A and 2B are photomicrographs magnified 1000 times illustrating a metallagraphic cross-section of a segment of an inner wear surface of a drill bushing in which the coating system of the present invention has been deposited on the inner wear surface before the coated structure (FIG. 2A) and after the coated structure (FIG. 2B) has been finished in accordance with the teachings of the present invention.
Figure 2B:
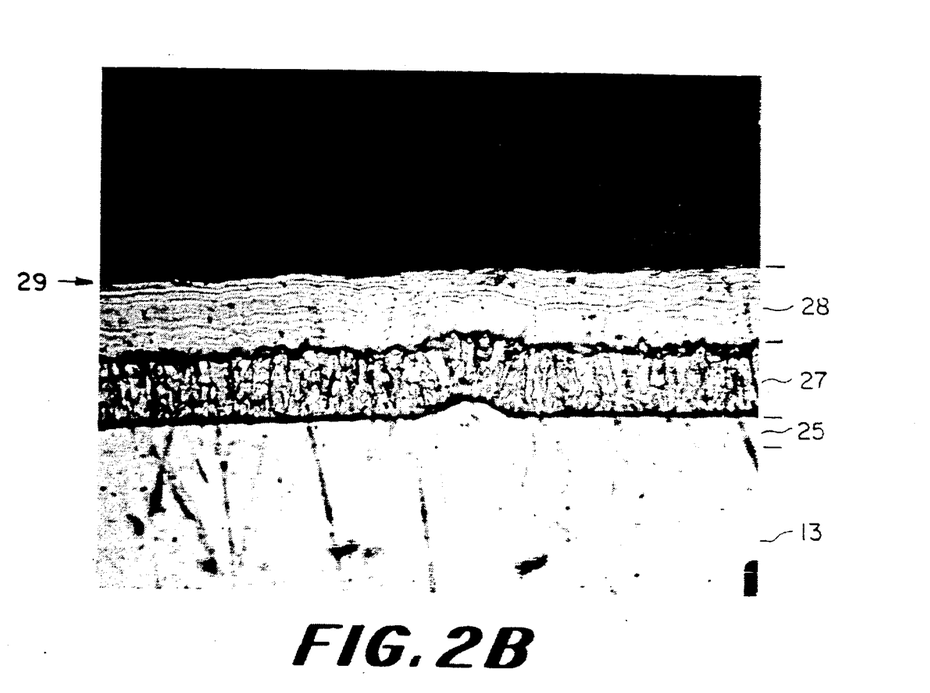

Referring to FIGS. 2A and 2B, a photomicrograph illustrating a metallagraphic cross-section of preferred coating system 17 of the present invention on the inner wear surface of a drill bushing comprising base layer 25 of nickel deposited directly onto the internal bores 13 and 15 of bushing 10 by means of electrochemical or electroless plating techniques. The thickness of the base layer 25 is selected to be sufficient to protect the part from the attack of corrosive gases typically generated during the chemical vapor deposition process. FIG. 2B illustrates the effect on the internal surface smoothness and uniformity by finishing the coated surface using a method of lapping with an abrasive paste.

Following formation of base layer 25, interlayer 27, which is comprised of substantially pure tungsten, is chemical vapor deposited to provide good adhesion between top coating 28 and base layer 25 and to further improve the erosion and abrasion wear resistance of the coating system.

Top coating 28 comprises a mixture of tungsten and tungsten carbide. The tungsten carbide may be $W_2C$, $W_3C$, or a mixture of $W_2C$ and $W_3C$. Coating 28 is fine grained, non-columnar and has a substantially layered microstructure and a thickness sufficient to provide the desired degree of erosion and abrasion wear resistance. The desired degree will depend upon the configuration of the structure and the use for which the structure is employed. Prior to the finishing step, the thickness of coating system 17 should be about 1 to 5 microns greater than that required to meet the final bushing inside diameter specification to accommodate for that portion of the coating lost during finishing. It has been found that the bushings coated in accordance with the present invention are unexpectedly capable of being finished by lapping to obtain a higher surface finish and finer surface adjustments on the inner diameter than is possible with prior art structures. This is especially valuable in very large manufacturing operations to accommodate the combined errors in various steps of the bushing manufacturing process. In addition, it has been found that the thickness of top coating 28 (typically about 5 to 20 microns), which has the highest wear resistance, is sufficient to accommodate such a finishing step and leave a top coating having a thickness of about 5 to 10 microns. This thickness ensures that the wear in the bushing occurs in the top layer during the entire life of the bushing, before it becomes oversized and must be replaced. FIG. 2B illustrates the effect on the surface smoothness and uniformity by finishing the surface in the manner taught in Example 6 below to result in very uniform, lapped surface 29. Overall, coated bushings from the present method are found to have a longer life than conventional bushings, thereby decreasing downtime and increasing productivity.

In general, the method in which such coating is deposited is described in detail in co-pending U.S. patent application Ser. No. 07/092,809, filed Sept. 3, 1987 and U.S. application Ser. No. 07/153,738, filed Feb. 8, 1988. The respective disclosures thereof are incorporated herein by reference.

In contrast to the method described in the foregoing co-pending applications, the coatings on the internal surfaces of the bushings and other structures of this invention are applied by placing them in a holder and directing the feed gas mixture through the heated internal surfaces. Therefore, the manner in which feed gas mixture is directed towards the heated internal surface presents one of the key features of the invention.

The thickness of the coatings, as described above, will vary depending upon the conditions and purpose for which the structure is used.

It is preferred, however, that base noble metal layer 25 deposited on a reactive metallic structure has a thickness between about 0.05 microns and about 5 microns, and top coating 28 has a thickness between about 5 microns to about 20 microns, preferably 10 micron and about 20 microns. Interlayer 27 has a thickness in the range from about 3 microns to about 20 microns and preferably the thickness is at least about 30% of the thickness of top coating 28.

It will be apparent to those skilled in the art, particularly from the discussion set forth below, that coating systems in accordance with the invention may be provided on other types of structures having internal wear surfaces in addition to those shown in FIG. 1. Thus, the structure illustrated in FIG. 1 is for the purposes of illustration only and is not meant to restrict the invention to the particular configuration shown. The invention is applicable to many other types of structures having internal wear surfaces, such as nozzles, jets, ducts, chutes, powder handling tubes, valve housings, conveyors, and the like.

Figure 3:
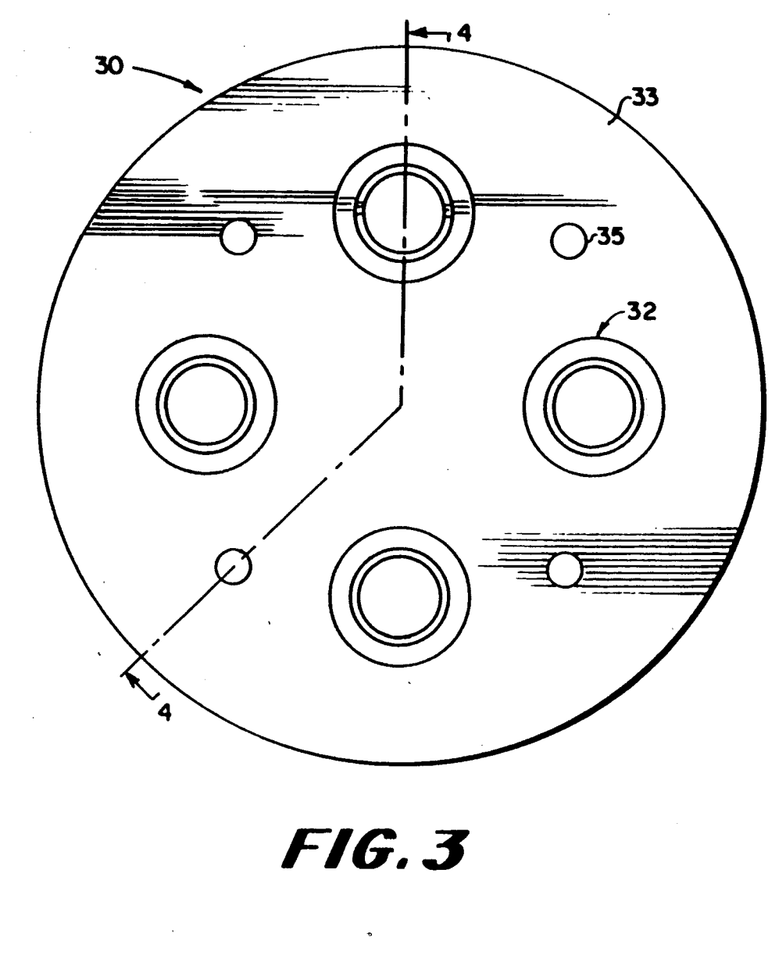
FIG. 3 is a top view of one type of a holder used to chemical vapor deposit the inner wear surfaces of drill bushings of the type illustrated in FIG. 1.
Figure 4:
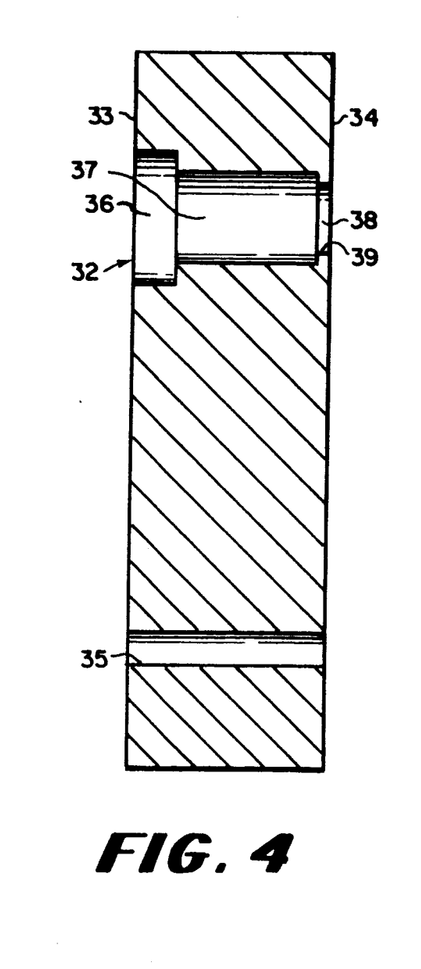
FIG. 4 is a side view of the holder illustrated in FIG. 3.
Figure 7:
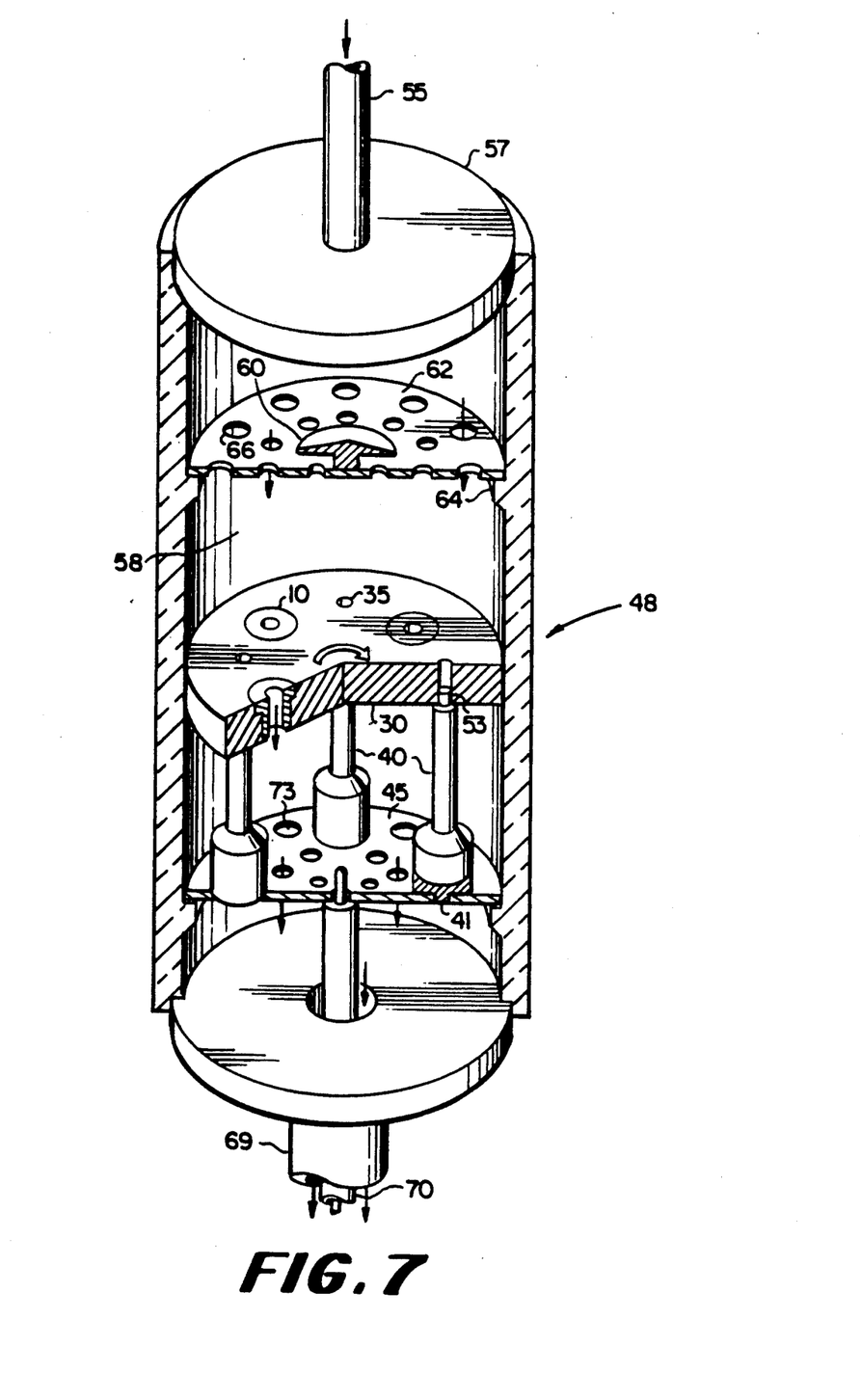
FIG. 7 is a schematic elevation view, partly in section, of a type of CVD reactor, containing the holder illustrated on FIGS. 3 and 4, the support legs illustrated in FIGS. 5 and 6 and the drill bushings mounted within the holder.

Referring now to FIGS. 3 and 4, holder 30 is used to hold the bushing for coating internal bores 13 and 15 in which passages 32 made up of a series of countersunk holes drilled between top face 33 and bottom face 34 to accommodate bushings 10. Four holes 35 are drilled through faces 33 and 34 for mounting holder 30 as shown in FIG. 7. Countersunk hole 36 has a diameter to easily fit the outside diameter of bushing head 14. i.e. with about 0.01 inch clearance, and countersunk hole 37 has a diameter to fit the outside diameter of body 11 with the same amount of clearance as head 14. The total length of holes 36 and 37 are substantially the same as the height of bushing 10. Countersunk holes 38 adjacent bottom face 34 have diameters less than the outside diameter of body 11. Holes 38 are designed to enable one to easily remove bushings 10 after bores 13 and 15 have been coated. The small amount of bridging of the coating between lower exterior surface 22 of bushing 10 and sidewall 39 of hole 38 is easily broken during the removal of bushing 10 from holder 30 after CVD without adversely affecting the critical tolerances for coating 17 on internal bore 13.

Figure 5:
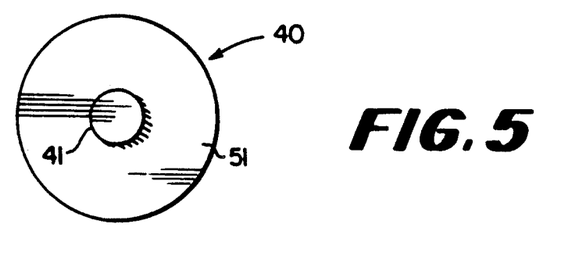
FIG. 5 is a top view of one type of support leg used to support the holder illustrated in FIGS. 3 and 4 on a lower apertured gas distributor plate of the chemical vapor deposition (CVD) reactor illustrated in FIG. 7 used to coat the inner wear surfaces of drill bushings of the type illustrated in FIG. 1.
Figure 6:
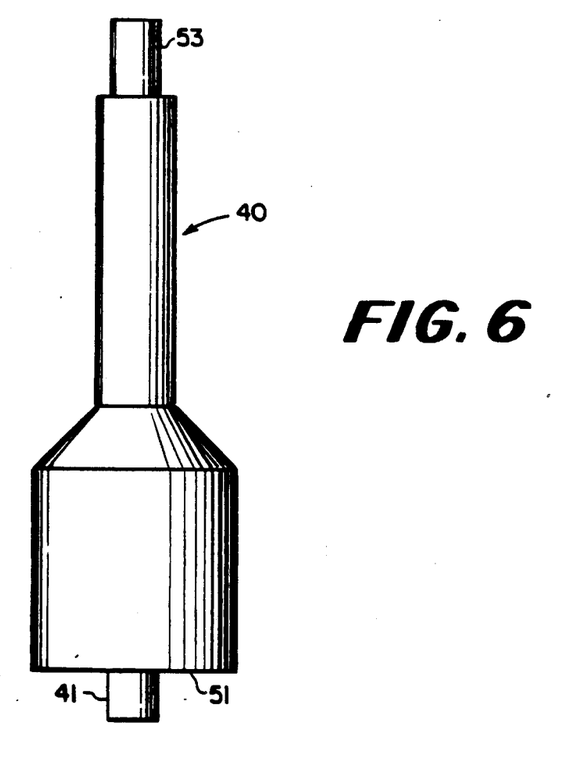
FIG. 6 is a side view of support leg illustrated in FIG. 5.

Referring now to FIGS. 5, 6 and 7, support leg 40 is used to support holder 30 on lower apertured gas distributor plate 45 of CVD reactor 48. Support leg 40 consists of mounting pin 41 which is mounted in an orifice in plate 45 to orient leg 40 in an upright position thereon within reactor 48 with lower face 51 in contact with upper face of plate 45 and support pin 53 which fits a portion of the way into hole 35 in holder 30. Gas inlet tube 55 conducts process gases through the reactor top 57. Inlet tube 55 is connected to a plurality of tubes (not shown) for introducing the desired process gases for depositing the coating by chemical vapor deposition within the reaction zone 5B. Blanking disk 60 is interposed between the feed gas inlet tube and upper apertured distributor plate 62 mounted on annular seat 64 to assure that the process gases are evenly distributed prior to passing through a plurality of non-uniform apertures 66 of plate 62. The gases in reaction zone 58 are then channelled uniformly through internal bores 15 and 13 of bushing 10 mounted in holder 30. The outside diameter of holder 30 is slightly smaller than the inside diameter of reactor 48 to permit rotation of holder 30, while at the same time to minimize channeling of process gases.

The reactor internals including bushing holders 30, support legs 40, upper apertured plate 62 and lower apertured plate 45 can all be constructed of a graphite, ceramic or metallic material.

Upper apertured plate 62 functions in cooperation with lower apertured plate 45, which is interposed between the reaction zone 58 and the effluent gas exhaust port 69. Lower apertured plate 45 similarly rests on shaft 70 and contains a plurality of non-uniform apertures 73. Shaft 70 can be rotated in the range between about 0 and 10 RPM to increase the uniformity of the coating.

EXAMPLES

For the purposes of further illustrating the invention, the following examples are provided:

EXAMPLE 1A

This example illustrates the effect of different pretreatments prior to coating drill bushings composed of 1144 carbon steel by CVD. These bushings were similar to the type shown in FIG. 1. The pretreatments included etching in nitric acid, plating with a protective nickel interlayer with and without abrasive precleaning, and no pretreatment except for solvent degreasing. The protective nickel interlayer was deposited using an electroless plating technique. These pretreated bushings were placed in the bushing holder comprised of SiC-6 Graphite similar to that illustrated in FIGS. 3 and 4.

The bushings mounted in the holder were then loaded into a 5.5 in. diameter graphite reactor of the type illustrated in FIG. 7 inside a gas-tight quartz outer shell. The outside diameter of holder 30 was 0.15 inch smaller than the inside diameter of reactor 48. Shaft 70 with holder 30 mounted thereon was rotated at 3 RPM. The bushings were then slowly brought to reaction temperature and coated with a tungsten interlayer and a tungsten/tungsten carbide ($W/W_xC$) top layer using the conditions described in Table 1. Hydrogen and tungsten hexafluoride were used as the gaseous precursors during the tungsten step, and dimethylether (DME) was used as an additional precursor during the tungsten/tungsten carbide step. In addition, argon was used as a diluent in both steps. After the coating reaction, the specimens were heat treated in argon for an hour and then cooled.

The coating on bushings degreased with the solvent and pretreated with nitric acid showed poor adhesion. On the contrary, the bushings pre-plated with nickel using the electroless plating technique with and without prior abrasive cleaning showed good coating adhesion. It is therefore necessary to protect the surface of reactive metals such as steels, stainless steels, and the like, with noble metals such as nickel prior to depositing tungsten followed by the tungsten/tungsten carbide coating.

The thicknesses of the different layers, as seen by metallography, were 5 to 7 microns of nickel, 12 to 16 microns of tungsten, and 2 to 3 microns of tungsten/tungsten carbide. All three layers were uniform across the entire cross section. The tungsten layer was columnar in nature and the tungsten/tungsten carbide layer had dense layered structure.

EXAMPLES 1B, 1C, 1D, and 1E

These examples illustrate the deposition of different thicknesses of tungsten and tungsten/tungsten carbide layers. The bushings coated in these examples were similar to the ones used in Example 1A, and were pre-plated with a thin layer of nickel using electroless plating techniques. They were deposited with W followed by $W/W_xC$ using process conditions which were similar to those used in Example 1A. The reaction times however were varied both for W and $W/W_xC$ steps to deposit different thicknesses of these layers, which are summarized in Table 2. The quality of the bushings coated in these examples was good based on visual inspection. Cross-sectional analysis of the bushings showed cracking or spalling of the coating in Examples 1B, 1C, and 1D, possibly due to an insufficient tungsten interlayer thickness. The coating deposited in Example 1E was crack-free, with a tungsten interlayer thickness of 13 microns. The tungsten/tungsten carbide layer deposited in these examples had a layered structure, with a microhardness varying between 2170 and 2400 $kgf/mm^2$.

EXAMPLES 1F and 1G

These examples also illustrate the deposition of different thicknesses of W and $W/W_xC$ layers, which were varied by using different reaction times and flow rates of feed gases, as shown in Table 1. The bushings coated in these runs were similar to those used in Example 1A, and were pre-plated with nickel using electroless plating technique. The quality of the bushings coated in these examples was good based on visual inspection. Cross-sectional analysis showed the bushings to be coated uniformly without cracks or spalling. The thicknesses of various layers deposited in these examples are provided in Table 2. The top layer had a layered structure. Additionally, X-ray diffraction of the bushing coated in Example 1F showed it to contain a mixture of W and $W_3C$ phases.

TABLE 1

Summary of Chemical Vapor Deposition Conditions

| Example No. | Reaction Temperature °C. | Reaction Pressure Torr | Deposition Step | Gas Flow Rates (std. l/m) | | | | Reaction Time, Min. |
|---|---|---|---|---|---|---|---|---|
| | | | | $H_2$ | $WF_6$ | DME | Argon | |
| 1A | 460 | 40 | W | 2.500 | 0.250 | — | 8.700 | 25 |
| | | | $W/W_xC$ | 3.000 | 0.300 | 0.090 | 2.900 | 20 |
| 1B | 460 | 40 | W | 2.500 | 0.250 | — | 8.700 | 15 |
| | | | $W/W_xC$ | 3.000 | 0.300 | 0.090 | 2.900 | 60 |
| 1C | 460 | 40 | W | 2.500 | 0.250 | — | 8.700 | 10 |
| | | | $W/W_xC$ | 3.000 | 0.300 | 0.090 | 2.900 | 60 |
| 1D | 460 | 40 | W | 2.500 | 0.250 | — | 8.700 | 20 |
| | | | $W/W_xC$ | 3.000 | 0.300 | 0.090 | 2.900 | 40 |
| 1E | 460 | 40 | W | 2.500 | 0.250 | — | 8.700 | 30 |
| | | | $W/W_xC$ | 3.000 | 0.300 | 0.090 | 2.900 | 40 |
| 1F | 460 | 40 | W | 1.250 | 0.125 | — | 4.350 | 30 |
| | | | $W/W_xC$ | 1.500 | 0.150 | 0.045 | 1.450 | 40 |
| 1G | 460 | 40 | W | 1.250 | 0.125 | — | 4.350 | 25 |
| | | | $W/W_xC$ | 1.500 | 0.150 | 0.045 | 1.450 | 40 |
| 2A | 460 | 40 | W | 2.500 | 0.250 | — | 8.700 | 30 |
| | | | $W/W_xC$ | 3.000 | 0.300 | 0.090 | 2.900 | 25 |
| 2B | 460 | 40 | W | 2.500 | 0.250 | — | 8.700 | 30 |
| | | | $W/W_xC$ | 3.000 | 0.300 | 0.090 | 2.900 | 30 |
| 2C | 460 | 40 | W | 2.500 | 0.250 | — | 8.700 | 35 |
| | | | $W/W_xC$ | 3.000 | 0.300 | 0.090 | 2.900 | 30 |

TABLE 2

Analysis of Coated Bushings

| Example No. | Coating Thickness, Microns | | | $W/W_xC$ Hardness, $kgf/mm^2$ |
|---|---|---|---|---|
| | Ni | W | $W/W_xC$ | |
| 1B | 5.0 | 7.9 | 12.3 | 2,400 |
| 1C | 5.1 | 5.5 | 13.2 | 2,170 |
| 1D | 4.6 | 11.9 | 8.8 | — |
| 1E | 2.6 | 13.0 | 8.9 | — |
| 1F | 2.5 | 17.7 | 11.7 | 2,120 |
| 1G | 2.5 | 13.0 | 8.5 | — |
| 2A | 2.5 | 12.4 | 5.2 | — |
| 2B | 2.1 | 13.7 | 6.8 | — |
| 2C | 1.9 | 20.4 | 6.4 | — |

EXAMPLES 2A, 2B, and 2C

These examples illustrate the method for coating uniformly the internal wear surfaces and the upper and lower faces of the bushings. The same type of 1144 carbon steel bushings coated in Example 1A were used in these examples and were pre-plated with nickel using electroless plating techniques. They were mounted in holders similar to the one presented in FIGS. 3 and 4 and coated in a reactor similar to the one described in Example 1A. The reaction conditions used were similar to those used in Example 1A and are summarized in Table 1. The quality of the bushings coated in these examples was good based on visual inspection. Cross-sectional analysis showed the bushings were deposited with crack-free and uniform coating, with thicknesses of various layers summarized in Table 2. The top layer had a layered structure.

EXAMPLE 3A

This example illustrates the effect of pretempering temperature on the bushing dimensions after CVD coating. A bushing of the type described in Example 1A that was conventionally tempered at 120° C. (Sample 2) and the same type of bushing that was specially tempered (Sample 1) at 510° C. These bushings were then deposited with a thin layer of nickel using electroless plating technique on the entire inner and outer surfaces. They were mounted in a holder similar to one used in Example 1A, and deposited with W followed by $W/W_xC$ in a reactor described in Example 1A using the reaction conditions summarized in Table 3. These bushings were deposited with uniform and crack-free coatings with thicknesses as shown in Table 4A. The tungsten/tungsten carbide top coat showed a layered structure with a microhardness of 2640 to 2670 $kgf/mm^2$. Furthermore, X-ray diffraction showed it to contain a mixture of W and $W_2C$ phases.

The measurements on the inner and outer diameter of the bushings are in Table 4B.

TABLE 3

Summary of Chemical Vapor Deposition Conditions

| Example No. | Sample No. | Reaction Temperature °C. | Reaction Pressure torr | Deposition Step | Gas Flow Rates (std l/m) | | | | Reaction Time, min |
|---|---|---|---|---|---|---|---|---|---|
| | | | | | $H_2$ | $WF_6$ | DME | Argon | |
| 3A | 1 and 2 | 460 | 40 | W | 2.500 | 0.250 | — | 8.700 | 25 |
| | | | | $W/W_xC$ | 3.000 | 0.300 | 0.100 | 2.900 | 45 |
| 3B | 1 and 2 | 460 | 40 | W | 1.500 | 0.150 | — | 8.700 | 45 |
| | | | | $W/W_xC$ | 3.000 | 0.300 | 0.110 | 2.900 | 55 |

TABLE 4B

Quality of Coated Bushings

| Example No. | Sample No. | Coating Thickness microns | | | $W/W_xC$ Micro-structure | $W/W_xC$ Hardnes kfg/$mm^2$ |
|---|---|---|---|---|---|---|
| | | Ni | W | $W/W_xC$ | | |
| 3A | 1 | 3.4 | 19.4 | 12.3 | Layered | 2640 |
| | 2 | 3.1 | 17.9 | 10.1 | Layered | 2670 |
| 3B | 1 | 3.6 | 26.3 | 15.4 | Layered | 2670 |
| | 2 | 3.4 | 25.6 | 16.2 | Layered | 2705 |

TABLE 4B

Effect of Pretempering on Dimensions of Bushings

| | Before CVD, inches | After CVD, inches | Change, inches |
|---|---|---|---|
| Sample #1 (510° C. pretemper) | | | |
| Outer diameter | 0.4996 | 0.4996 | 0 |
| Inner diameter | 0.2370 | 0.2344 | 0.0026 |
| Sample #2 (120° C. pretemper) | | | |
| Outer diameter | 0.5003 | 0.4995 | 0.0008 |
| Inner diameter | 0.2443 | 0.2413 | 0.0030 |

As seen, the outer diameter of the bushing (Sample #1), pretempered at 510° C., did not change after CVD coating, but that of the bushing (Sample #2), pretempered at 120° C., decreased. This information showed that the outside diameter of 1144 carbon steel bushing pretempered at conventional temperature changed (decreased) during the chemical vapor deposition reaction. This change in dimension is however noted only for bushings made of carbon steels. It is not noted with the bushings made of tool steels, stainless steels, nickel and titanium alloys. The change in inside diameter is mostly due to the coating. Therefore, it would be desirable to pretemper carbon steel structures at or above the chemical vapor deposition temperature prior to coating to maintain or meet critical dimensional requirements.

EXAMPLE 3B

The pretreatment and coating procedures described in Example 3A were repeated in this example with minor changes in the processing conditions. Once again, a conventionally tempered and a specially tempered 1144 carbon steel bushings were used. They were plated with a thin layer of nickel using electroless plating technique. The plated bushings were buffed with colloidal silica-laden flannel cloth to improve surface finish. They were then coated with W followed by $W/W_xC$ using the conditions summarized in Table 3. These bushings were deposited with smooth, crack-free and adherent coatings. Metallographic analysis showed very uniform coatings on both the 510° C. and 120° C. tempered bushings. The thicknesses of both W and $W/W_xC$ layers deposited are shown in Table 4A. The $W/W_xC$ layer had a layered microstructure and a hardness varying from 2670 to 2705 $kgf/mm^2$. X-ray diffraction analysis of $W/W_xC$ layer revealed it to contain a mixture of W and $W_2C$ phases.

EXAMPLE 4A

This example illustrates the deposition of highly uniform coating on the bushings similar to the ones described in Example 1A. The bushings were pretempered at 510° C. and plated completely with nickel using electroless plating techniques. The plated bushings were buffed prior to coating as described in Example 3B. They were then coated with W followed by $W/W_xC$ L using the conditions shown in Table 5. The bushings were deposited with a smooth, crack-free, and adherent W followed by W/W$_x$C coating. One of the coated bushings was sectioned at three places, top, middle and bottom to determine coating thickness and microstructure. It was coated with fairly uniform coating, overall coating thickness of the three layers was 29.1±1.1 microns, which is within ±3.9% of the mean. (See Table 6) The W/W$_x$C coating had a layered structure with hardness in the range of 2190–2240 kgf/mm$^2$.

reactor. A number of bushings similar to the ones described in Example 1A were tempered at 510° C., plated with nickel using electroless plating technique, buffed with colloidal silica, mounted in a holder similar in design to the one shown in FIGS. 3 and 4, and deposited with W followed by W/W$_x$C using conditions summarized in Table 7. All the bushings were deposited with smooth and adherent coatings. Metallographic analysis revealed very uniform deposition of nickel and W/W$_x$C layers, as shown in Table 8. The tungsten interlayer,

TABLE 5

Summary of Chemical Vapor Deposition Conditions

| Example No. | Reaction Temperature °C. | Reaction Pressure torr | Deposition Step | Gas Flow Rates (std l/m) | | | | Reaction Time, min |
|---|---|---|---|---|---|---|---|---|
| | | | | H$_2$ | WF$_6$ | DME | Argon | |
| 4A | 460 | 40 | W | 1.250 | 0.125 | — | 12.180 | 30 |
|    |     |    | W/W$_x$C | 3.000 | 0.300 | 0.115 | 3.190 | 55 |
| 4B | 460 | 40 | W | 1.250 | 0.125 | — | 12.180 | 30 |
|    |     |    | W/W$_x$C | 3.000 | 0.300 | 0.115 | 3.190 | 55 |

TABLE 6

Quality of Coated Bushings

| Example No. | Cross-Section | Coating Thickness, Microns | | | W/W$_x$C Hardness (kgf/mm$^2$) |
|---|---|---|---|---|---|
| | | Ni | W | W/W$_x$C | |
| 4A | Top | 4.9 ± 0.4 | 12.1 ± 0.4 | 13.2 ± 0.2 | 2240 |
|    | Middle | 4.7 ± 1.1 | 11.8 ± 0.3 | 12.4 ± 0.1 | 2240 |
|    | Bottom | 4.8 ± 0.9 | 11.3 ± 0.2 | 12.3 ± 0.2 | 2190 |
| 4B | Top | 5.5 ± 0.3 | 12.6 ± 0.5 | 13.5 ± 0.5 | 2600 |
|    | Middle | 4.3 ± 1.4 | 12.1 ± 0.5 | 13.1 ± 0.2 | 2540 |
|    | Bottom | 4.7 ± 0.5 | 11.4 ± 0.1 | 13.4 ± 0.5 | 2480 |

EXAMPLE 4B

This example illustrates the deposition of highly uniform coating on larger diameter 1144 carbon steel bushings. The procedures used for preparing and coating bushings were identical to those described in Example 4A. The reaction conditions used are summarized in Table 5. The bushings were deposited with smooth and highly uniform coating, as shown in Table 6. The overall coating thickness of the three layers was 30.0±1.3 microns, which is within ±4.5% of the mean. The W/W$_x$C coating had a layered microstructure.

EXAMPLE 5A

This example illustrates deposition of W followed by W/W$_x$C coating on bushings in a 12.75 inch diameter although very uniform across each cross section, showed some thickness variation along the length of the bushings. The W/W$_x$C layer had layered structure with hardness close to 2700 kgf/mm$^2$.

EXAMPLE 5B

The procedures used for depositing W followed by W/W$_x$C on 1144 carbon steel bushings in Example 5A was repeated in this example with minor changes in the reaction conditions to improve coating uniformity. The reaction conditions used were summarized in Table 7. Once again, all the bushings were deposited with smooth and adherent coating. Additionally, they were deposited with extremely uniform coating, as shown in Table 8. The W/W$_x$C layer had a layered structure and hardness in the range of 2,600 kgf/mm$^2$.

TABLE 7

Summary of Chemical Vapor Deposition Conditions

| Example No. | Reaction Temperature °C. | Reaction Pressure torr | Deposition Step | Gas Flow Rates (std l/m) | | | | Reaction Time min |
|---|---|---|---|---|---|---|---|---|
| | | | | H$_2$ | WF$_6$ | DME | N$_2$ | |
| 5A | 530 | 40 | W | 6.70 | 0.67 | — | 65.4 | 30 |
|    | 520 | 40 | W/W$_x$C | 16.10 | 1.61 | 0.62 | 17.1 | 55 |
| 5B | 510 | 40 | W | 6.70 | 0.67 | — | 65.4 | 60 |
|    | 520 | 40 | W/W$_x$C | 16.10 | 1.61 | 0.62 | 20.7 | 65 |

TABLE 8

Quality of Coated Bushings

| Example No. | Sample No. | Top | | Middle | | Bottom | | W/W$_x$C Hardness, kgf/mm$^2$ |
|---|---|---|---|---|---|---|---|---|
| | | W | W/W$_x$C | W | W/W$_x$C | W | W/W$_x$C | |
| 5A | 1 | 5.4 ± 0.2 | 12.0 ± 0.2 | 3.8 ± 0.3 | 11.0 ± 0.5 | 2.8 ± 0.1 | 10.6 ± 0.3 | |
|    | 2 | 6.8 ± 0.5 | 12.7 ± 0.2 | 4.8 ± 0.2 | 12.1 ± 0.2 | 3.7 ± 0.2 | 11.1 ± 0.4 | 2,720 |
|    | 3 | 6.5 ± 0.6 | 12.9 ± 0.2 | 4.7 ± 0.3 | 11.1 ± 0.6 | 2.7 ± 0.1 | 11.3 ± 0.2 | |
| 5B | 1 | 16.4 ± 0.6 | 14.3 ± 0.5 | 15.8 ± 0.4 | 14.3 ± 0.0 | 13.4 ± 0.8 | 14.1 ± 0.4 | |

TABLE 8-continued

| Example No. | Sample No. | Quality of Coated Bushings | | | | | | W/W$_x$C Hardness, kgf/mm$^2$ |
|---|---|---|---|---|---|---|---|---|
| | | Coating Thickness, Micron | | | | | | |
| | | Top | | Middle | | Bottom | | |
| | | W | W/W$_x$C | W | W/W$_x$C | W | W/W$_x$C | |
| | 2 | 15.8 ± 0.4 | 16.9 ± 0.0 | 16.3 ± 0.7 | 14.0 ± 0.4 | 15.6 ± 0.0 | 14.5 ± 0.4 | 2,600 |
| | 3 | 16.7 ± 1.0 | 16.0 ± 0.4 | 16.3 ± 0.5 | 14.5 ± 0.4 | 14.5 ± 0.4 | 14.5 ± 0.3 | |

EXAMPLE 6

This example illustrates a procedure used for lapping the coated bushing to improve surface finish. A number of 1144 carbon steel bushings were deposited with W followed by W/W$_x$C using the procedure described in Example 4B. A coated bushing was then sectioned to determine the surface finish of as-deposited coating, which is shown in FIG. 2A. A number of surface irregularities, although marginal, were seen. Another coated bushing was lapped with three micron diamond paste on an expandable brass lap under Spectrum diamond lapping oil lubricant at 120 rpm to reduce/eliminate surface irregularities. The lapping was continued till the inner surface showed a bright and reflective surface finish. The cross-sectional photomicrograph of the lapped segment is shown in FIG. 2B. It clearly showed the removal or elimination of surface irregularities. Therefore, a diamond lapping technique can be used to improve interior surface finish of the coated bushings, if needed.

DISCUSSION

The present invention enables one to increase the useful life of structures having internal wear surfaces, such as drill bushings and the like, made of ferrous and non-ferrous metals and alloys, metal matrix composites and metal carbide. In accordance with the invention a hard, fine-grained, non-columnar tungsten carbide coating system having a substantially layered microstructure is provided using a chemical vapor deposition technique. The internal surface or surfaces can be coated while at the same time maintaining the very tight tolerances. Furthermore, the stringent internal surface finish requirements can be met by using relatively simple finishing techniques.

Various modifications of the invention in addition to those shown and described herein will become apparent to those skilled in the art from the foregoing description and accompanying drawings. Such modifications are intended to fall within the scope of the appended claims.

What is claimed is:

1. A low temperature chemical vapor deposition method for increasing the wear life and hardness of an internal surface of a structure comprising a material selected from the group consisting of ferrous and non-ferrous metals and alloys, metal matrix composites and metal carbides, said method comprising the steps of directing to an internal surface of said structure a first reaction mixture of process gases comprising a tungsten halide and hydrogen to chemical vapor deposit an intermediate layer of substantially pure columnar tungsten thereon; directing to said tungsten coated internal surface a second reaction mixture of process gases comprising (1) a tungsten halide, (2) a volatile oxygen- and hydrogen-containing organic compound, and (3) hydrogen; controlling the flow rate of said tungsten halide and said oxygen- and hydrogen-containing organic compound in said second reaction mixture so that the W/C atomic ratio is within the range of about 0.5 to about 15 to chemical vapor deposit a mixture of W and W$_2$C, W and W$_3$C, or W and W$_2$C and W$_3$C as a top coat onto said intermediate tungsten layer; controlling the amount of said hydrogen present in the first and second reaction mixtures during the chemical vapor deposition steps so that the amount is more than the stoichiometric amount required for the reduction of said tungsten halide; controlling the chemical vapor deposition temperature in the range of about 300° to about 650° C.; controlling the chemical vapor deposition pressure within the range of about 1 Torr. to about 1000 Torr., said top coating being fine grained, non-columnar and having a substantially layered microstructure and a thickness sufficient to confer a desired degree of wear resistance and hardness on said internal surface.

2. A method according to claim 1 which said structure is mounted within a holder to expose only the internal surface to the first and second reaction mixtures.

3. A method according to claim 1 wherein the thickness of said top coating is between about 5 microns and about 20 microns.

4. A method according to claim 3 wherein the thickness of said interlayer is at least about 30% of the thickness of said top coating.

5. A method according to claim 1 wherein the chemical vapor deposition temperature is in the range of about 300° to about 550° C.

6. A method according to claim 1 wherein an inert gas is added as a diluent to said first and second reaction mixtures.

7. A method according to claim 1 wherein a base layer of a noble metal is provided directly on said surface prior to chemical vapor deposition, said base metal layer having a thickness sufficient to protect said surface from corrosion during chemical vapor deposition.

8. A method according to claim 7 wherein said noble metal is selected from the group consisting of nickel, cobalt, copper, silver, gold, platinum, palladium, iridium, and mixtures thereof.

9. A method according to claim 8 wherein said noble metal layer is deposited by means of electrochemical or electroless plating techniques.

10. A method according to claim 1 wherein the ratio of hydrogen to tungsten halide in the first and second reaction mixtures is in the range of about 4 to about 20.

11. A method according to claim 10 wherein the ratio of hydrogen to tungsten halide in the first and second reaction mixtures is in the range of about 5 to about 10.

12. A method according to claim 1 wherein said oxygen- and hydrogen-containing organic compound is dimethyl ether.

13. A method according to claim 1 wherein the resulting coated internal wear surface is finished to the desired specifications.

14. A method according to claim 13 wherein said finishing step comprises lapping the resulting coated interior surface with an abrasive paste.

15. A low temperature chemical vapor deposition method for increasing the wear life and hardness of an internal wear surface of a carbon steel structure, said method comprising the steps of:
   (a) tempering said structure at a temperature greater than the temperature used in the chemical vapor deposition to prevent further changes in dimensions during the subsequent processing steps;
   (b) providing a base layer of a noble metal on said internal wear surface, said base metal layer having a thickness sufficient to protect said surface from corrosion during chemical vapor deposition;
   (c) chemical vapor depositing a substantially pure tungsten interlayer onto said noble metal coated internal surface at a temperature in the range of about 300° to about 650° C., and
   (d) chemical vapor depositing onto said tungsten interlayer a top coating of a mixture of tungsten and tungsten carbide wherein said tungsten carbide is selected from the group consisting of $W_2C$, $W_3C$, and mixtures of $W_2C$ and $W_3C$ at a temperature in the range of about 300° to about 650° C., said top coating being fine grained, non-columnar and having a substantially layered microstructure and a thickness sufficient to confer a desired degree of wear resistance and hardness on said internal wear surface.

16. A method according to claim 15 wherein the resulting coated internal wear surface is finished to the desired specifications.

17. A method according to claim 16 wherein said finishing step comprises lapping the resulting coated interior surface with an abrasive paste.

18. A method according to claim 15 in which said carbon steel structure is mounted within a holder to expose only the internal surface to coating during the chemical vapor deposition steps.

19. A method according to claim 15 wherein the chemical vapor deposition temperature is in the range of about 300° to about 550° C.

20. A method according to claim 15 wherein the thickness of said base metal layer is between about 0.05 microns and 5 microns, and wherein the thickness of said top coating is between about 5 micron and about 20 microns.

21. A method according to claim 15 wherein the thickness of said top coating is greater than the thickness of said base metal layer.

22. A method according to claim 15 wherein the thickness of said tungsten interlayer is at least about 30% of the thickness of said top coating.

23. A method according to claim 15 wherein said noble metal is selected from the group consisting of nickel, cobalt, copper, silver, gold, platinum, palladium, irridium, and mixtures thereof.

24. A method according to claim 23 wherein said noble metal layer is deposited by means of electrochemical or electroless plating techniques.

* * * * *